(12) United States Patent
Lenski et al.

(10) Patent No.: US 8,987,103 B2
(45) Date of Patent: Mar. 24, 2015

(54) MULTI-STEP DEPOSITION OF A SPACER MATERIAL FOR REDUCING VOID FORMATION IN A DIELECTRIC MATERIAL OF A CONTACT LEVEL OF A SEMICONDUCTOR DEVICE

(75) Inventors: Markus Lenski, Dresden (DE); Kerstin Ruttloff, Hainichen (DE); Volker Jaschke, Radebeul (DE); Frank Seliger, Dresden (DE); Ralf Otterbach, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 671 days.

(21) Appl. No.: 12/776,674

(22) Filed: May 10, 2010

(65) Prior Publication Data
US 2010/0289083 A1 Nov. 18, 2010

(30) Foreign Application Priority Data

May 15, 2009 (DE) .......................... 10 2009 021 490

(51) Int. Cl.
*H01L 21/336* (2006.01)
*H01L 21/8234* (2006.01)
*H01L 21/768* (2006.01)

(52) U.S. Cl.
CPC ... *H01L 21/823468* (2013.01); *H01L 21/76837* (2013.01); *H01L 21/76895* (2013.01); *H01L 21/823425* (2013.01)
USPC .................................. 438/303; 257/E21.626

(58) Field of Classification Search
None
See application file for complete search history.

(56) References Cited

U.S. PATENT DOCUMENTS

| | | | | |
|---|---|---|---|---|
| 5,807,782 A * | 9/1998 | Koh et al. | ...................... | 438/396 |
| 5,882,973 A * | 3/1999 | Gardner et al. | ................ | 438/279 |
| 5,918,141 A * | 6/1999 | Merrill | ........................ | 438/583 |
| 6,562,676 B1 | 5/2003 | Ju | ................................. | 438/232 |
| 6,686,232 B1 | 2/2004 | Ngo et al. | ...................... | 438/197 |
| 2002/0168861 A1* | 11/2002 | Chiu et al. | ...................... | 438/706 |
| 2005/0186722 A1* | 8/2005 | Cheng et al. | .................. | 438/199 |
| 2005/0250280 A1* | 11/2005 | Lin et al. | ........................ | 438/238 |
| 2005/0260808 A1* | 11/2005 | Chen et al. | ..................... | 438/197 |
| 2006/0292883 A1* | 12/2006 | Tsai | ................................ | 438/710 |
| 2009/0108415 A1* | 4/2009 | Lenski et al. | .................. | 257/649 |
| 2009/0294986 A1* | 12/2009 | Yan et al. | ...................... | 257/774 |

FOREIGN PATENT DOCUMENTS

| DE | 102005057073 A1 | 5/2007 | .......... H01L 21/8238 |
|---|---|---|---|
| DE | 102007052220 A1 | 5/2009 | .......... H01L 21/8238 |

OTHER PUBLICATIONS

Translation of Official Communication from German Patent Office for German Patent Application No. 10 2009 021 490.9-33 dated Mar. 2, 2010.

* cited by examiner

*Primary Examiner* — Bilkis Jahan
*Assistant Examiner* — Kevin Quinto
(74) *Attorney, Agent, or Firm* — Amerson Law Firm, PLLC

(57) ABSTRACT

In advanced semiconductor devices, spacer elements may be formed on the basis of a multi-station deposition technique, wherein a certain degree of variability of the various sublayers of the spacer materials, such as a different thickness, may be applied in order to enhance etch conditions during the subsequent anisotropic etch process. Consequently, spacer elements of improved shape may result in superior deposition conditions when using a stress-inducing dielectric material. Consequently, yield losses due to contact failures in densely packed device areas, such as static RAM areas, may be reduced.

21 Claims, 6 Drawing Sheets

MULTI-STEP DEPOSITION OF A SPACER MATERIAL FOR REDUCING VOID FORMATION IN A DIELECTRIC MATERIAL OF A CONTACT LEVEL OF A SEMICONDUCTOR DEVICE

BACKGROUND OF THE INVENTION

1. Field of the Invention

Generally, the present disclosure relates to the field of integrated circuits, and, more particularly, to field effect transistors and manufacturing techniques on the basis of stressed dielectric layers formed above the transistors and used for generating a strain in channel regions of the transistors.

2. Description of the Related Art

Integrated circuits typically include a very large number of circuit elements located on a given chip area according to a specified circuit layout, wherein, in complex circuits, the field effect transistor represents one predominant circuit element. Generally, a plurality of process technologies for advanced semiconductor devices are currently practiced, wherein, for complex circuitry based on field effect transistors, such as microprocessors, storage chips and the like, CMOS technology is currently one of the most promising approaches due to the superior characteristics in view of operating speed and/or power consumption and/or cost efficiency. During the fabrication of complex integrated circuits using CMOS technology, millions of complementary transistors, i.e., N-channel transistors and P-channel transistors, are formed on a substrate including a crystalline semiconductor layer. A field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, the conductivity of the channel region substantially determines the performance of the MOS transistors. Thus, the reduction of the channel length, and associated therewith the reduction of the channel resistivity, may be a dominant design criterion for accomplishing an increase in the operating speed of the integrated circuits.

The shrinkage of the transistor dimensions, however, involves a plurality of issues associated therewith that have to be addressed so as to not unduly offset the advantages obtained by steadily decreasing the channel length of MOS transistors. One issue associated with reduced gate lengths is the occurrence of so-called short channel effects, which may result in a reduced controllability of the channel conductivity. Short channel effects may be countered by certain design techniques, some of which, however, may be accompanied by a reduction of the channel conductivity, thereby partially offsetting the advantages obtained by the reduction of critical dimensions.

In view of this situation, it has been proposed to enhance device performance of the transistor elements not only by reducing the transistor dimensions but also by increasing the charge carrier mobility in the channel region for a given channel length, thereby increasing the drive current capability and thus transistor performance. For example, the lattice structure in the channel region may be modified, for instance, by creating tensile or compressive strain therein, which results in a modified mobility for electrons and holes, respectively. For instance, creating tensile strain in the channel region of a silicon layer having a standard crystallographic configuration may increase the mobility of electrons, which in turn may directly translate into a corresponding increase of the conductivity of N-type transistors. On the other hand, compressive strain in the channel region may increase the mobility of holes, thereby providing the potential for enhancing the performance of P-type transistors.

One efficient approach in this respect is a technique that enables the creation of desired stress conditions within the channel region of different transistor elements by adjusting the stress characteristics of a dielectric layer stack that is formed above the basic transistor structure. The dielectric layer stack typically comprises one or more dielectric layers which may be located close to the transistor and which may also be used in controlling a respective etch process in order to form contact openings connecting to the gate and drain and source terminals. Therefore, an effective control of the mechanical stress in the channel regions, i.e., an effective stress engineering, may be accomplished by individually adjusting the internal stress of these layers, which may also be referred to as contact etch stop layers, and by positioning a contact etch stop layer having an internal compressive stress above a P-channel transistor while positioning a contact etch stop layer having an internal tensile strain above an N-channel transistor, thereby creating compressive and tensile strain, respectively, in the associated channel regions.

Typically, the contact etch stop layer is formed by plasma enhanced chemical vapor deposition (PECVD) processes above the transistor, i.e., above the gate structure and the drain and source regions, wherein, for instance, silicon nitride may be used due to its high etch selectivity with respect to silicon dioxide, which is a well-established interlayer dielectric material. Furthermore, PECVD silicon nitride may be deposited with a high intrinsic stress, for example, up to 2 Giga Pascal (GPa) or significantly higher of compressive stress and up to 1 GPa and significantly higher of tensile stress, wherein the type and the magnitude of the intrinsic stress may be efficiently adjusted by selecting appropriate deposition parameters. For example, ion bombardment, deposition pressure, substrate temperature, gas flow rates and the like represent efficient parameters that may be used for obtaining the desired intrinsic stress.

Forming one or more stress-inducing dielectric materials above the basic transistor configurations may, therefore, represent a promising technique for further enhancing performance of transistors, wherein the degree of performance gains may significantly depend on the internal stress level of the dielectric materials and the amount of stressed material that may be positioned close to the channel region of the transistors. For this reason, deposition recipes have been developed which may enable the deposition of stressed silicon nitride materials with an internal stress level in the above-indicated range, wherein additionally, the layer thickness of the silicon nitride materials may be selected as thick as possible in order to obtain a maximum stress transfer for a given achievable internal stress level. It turns out, however, that, in extremely scaled semiconductor devices, additional device failures may occur during the formation of the critical contact level on the basis of stressed silicon nitride materials, as will be described in more detail with reference to FIG. 1a.

FIG. 1a schematically illustrates a top view of a semiconductor device 100 which may represent any advanced semiconductor device including highly scaled transistor elements, such as transistors 150A, 150B. For example, the circuit portion illustrated in FIG. 1a may represent a portion of a RAM (random access memory) region in which, typically, a plurality of transistors are closely packed so as to provide a high bit density. The semiconductor device 100 may comprise an appropriate substrate (not shown) above which are provided semiconductor regions 103A, 103B, which may be considered as "active" regions so as to form therein transistor elements, such as the transistors 150A, 150B. Furthermore, the active regions 103A, 103B may be embedded and may thus be laterally separated by an appropriate isolation structure 102, which is typically provided in the form of a shallow trench isolation in advanced applications. The transistors 150A, 150B comprise gate electrodes 151A, 151B, respectively, which may be formed above the corresponding active regions 103A, 103B and which may extend into a neighboring active region in order to provide an efficient interconnect structure between the individual circuit elements of the semiconductor device 100. For example, the gate electrode structure 151B may be formed above the active region 103B and may also extend along the isolation structure 102 into the active region 103A so as to enable a contact of the gate electrode structure 151B with the transistor 150A via a corresponding contact element 160A. Similarly, the gate electrode structure 151A of the transistor 150A may be formed above the active region 103A and may extend along the isolation structure 102 into the active region 103B, in which a contact element 160B may connect the gate electrode structure 151A with the transistor 150B.

The semiconductor device 100 as illustrated in FIG. 1a is typically formed on the basis of the following processes. First, the isolation structure 102 may be formed, for instance, by sophisticated lithography techniques for providing an etch mask in order to determine the position and lateral size of corresponding trenches that may be formed in the semiconductor material. Thereafter, the trenches may be etched into the semiconductor material and may be subsequently filled with any appropriate dielectric material, such as silicon dioxide and the like, thereby defining the position and size of the active regions 103A, 103B. Next, the basic doping of the active regions 103A, 103B may be generated, for instance, by implantation processes using an appropriate masking regime in order to selectively introduce a required dopant species into the active regions 103A, 103B. In the example shown in FIG. 1a, it may be assumed that the active regions 103A, 103B may represent active regions for P-channel transistors and may therefore be exposed during a corresponding implantation process for incorporating an N-type dopant species, while other active regions (not shown) of N-channel transistors are masked, for instance, by a resist material. Next, the gate electrode structures 151A, 151B are provided by forming an appropriate gate dielectric material, such as a silicon dioxide-based material, a high-k dielectric material, which is to be understood as a dielectric material having a dielectric constant of approximately 10.0 or higher, and the like. It should be appreciated that, in sophisticated semiconductor devices, typically, a length of the gate electrode structures 151A, 151B may be in the range of approximately 50 nm and less, thereby requiring extremely thin silicon dioxide-based gate dielectric material which may result in a significant leakage current. For this reason, increasingly, silicon dioxide-based materials may be replaced, at least partially, by a high-k dielectric material, which may provide a superior capacitive coupling, however, at a significantly high physical thickness, thereby reducing the gate leakage currents. After the formation of the gate dielectric material, one or more appropriate electrode materials are deposited on the basis of any appropriate deposition technique. For instance, silicon may typically be used as an electrode material, possibly in combination with additional cap materials and the like, as are required for the patterning of the layer stack and the further processing of the device 100. In other cases, in addition to silicon-based material, or alternatively, other electrode materials, such as metal-containing materials and the like, may be used for enhancing overall conductivity of the gate electrode structures 151A, 151B. The patterning of the layer stack typically requires highly sophisticated lithography techniques in combination with specific etch recipes in order to obtain a desired gate length in accordance with the design rules.

Thereafter, drain and source regions 152 are formed in the active regions 103A, 103B on the basis of implantation processes, possibly in combination with other techniques, such as the incorporation of an in situ doped semiconductor material in corresponding cavities, which may be provided laterally adjacent to the gate electrode structures 151A, 151B according to some conventional process strategies. Since complex lateral dopant profiles are typically required, a sidewall spacer structure 153, indicated as dashed lines, is formed on sidewalls of the gate electrode structures 151A, 151B, thereby defining a desired lateral offset of at least a portion of the drain and source regions 152 during a corresponding implantation sequence. The spacer structure 153 is typically formed by using thermally activated chemical vapor deposition (CVD) techniques, plasma enhanced CVD techniques and the like, in combination with anisotropic etch processes. That is, a conformal spacer material in the form of a silicon nitride material is deposited and is then anisotropically etched, wherein, due to the topography of the gate electrode structures 151A, 151B, material remains at sidewalls of the gate structures 151A, 151B after the end of the anisotropic etch process. Thereafter, deep drain and source areas of the drain and source regions 152 may be formed on the basis of implantation processes using the gate electrode structures 151A, 151B and the spacer structure 153 as an efficient implantation mask. Subsequently, anneal processes are performed in order to activate the dopant species and re-crystallize implantation-induced damage. Next, typically, a silicidation process is performed in which a refractory metal, such as nickel, platinum, cobalt and the like, is deposited and is heat treated so as to react with the crystalline silicon material in the active regions 103B, 103A, thereby forming a metal silicide that exhibits a significantly lower sheet resistivity compared to the doped drain and source regions 152. During the corresponding silicidation process, the spacer structure 153 also provides a corresponding offset of metal silicide regions (not shown) with respect to the gate electrode structures 151A, 151B since metal silicide may not be formed on dielectric surface areas, such as the spacer structure 153 and the isolation structure 102.

Consequently, the spacer structure 153 may have a significant influence on the overall performance of the resulting transistors 150A, 150B since the lateral dopant profile and the overall sheet resistivity of the drain and source regions 152 may be affected by the spacer structure 153. For this reason, deposition recipes are typically used in which a substantially conformal deposition behavior with the required material characteristics may be accomplished at an acceptable cycle time. That is, due to economic constraints, the profit-ability of semiconductor facilities may not only depend on the overall production yield, i.e., the ratio of good products to non-acceptable products, but also on a short cycle time, which may be accomplished by maintaining the number of individual process steps at an acceptable level and by reducing the cycle time of individual processes. For this reason, frequently, deposition processes may be performed in a "pipelined" manner in which two or more deposition chambers may be sequentially passed so as to obtain the desired layer thickness without requiring undue transport capabilities for transferring a substrate from one process chamber to the next one. By performing a deposition process on the basis of a plurality of sequentially performed process steps, the overall cycle time may be reduced, while the transport resources may also be significantly less compared to the provision of the same number of process chambers operated in a parallel manner. Thus, the silicon nitride spacer material for the structure 153 is frequently deposited on the basis of multiple deposition steps, each resulting in a sub-layer of the same thickness. Moreover, forming a plurality of sub-layers of the same thickness may result in superior process control, thereby contributing to increased process uniformity for forming the spacer structure 153. Enhanced uniformity of the spacer structure 153 may directly translate into enhanced uniformity of the drain and source regions 152 and the corresponding metal silicide areas.

After completing the basic transistor configuration, i.e., after forming the metal silicide regions at least in the drain and source regions 152, a stress-inducing dielectric material, such as a silicon nitride material, is typically deposited, for instance in the form of a highly compressively stressed silicon nitride material, above the transistors 150A, 150B when representing P-channel transistors. During the deposition process, the layer thickness and thus the amount of highly stressed dielectric material is substantially determined by the distance 153D of the spacer structures 153, since selecting a thickness that is greater than half of the distance 153D may result in a significant void generation between the spacer structures 153. Consequently, an appropriate layer thickness is selected on the basis of overall configuration of the device 100 in order to provide one or more stressed dielectric materials. For example, a tensile stressed dielectric material may be positioned above N-channel transistors while a compressive stressed dielectric material may be positioned above the transistors 150A, 150B, wherein any appropriate patterning strategy may be applied. Thereafter, a further interlayer dielectric material, such as silicon dioxide and the like, may be deposited and may be planarized. The interlayer dielectric material in combination with the stress-inducing dielectric silicon nitride material may then be patterned so as to obtain corresponding openings which may then be filled with an appropriate metal, such as tungsten, possibly in combination with appropriate barrier materials, thereby forming the contact elements 106A, 106B.

After the above-described process sequence, it turns out, however, that, in particular in sophisticated device geometries, i.e., in semiconductor devices having a gate length in the above-specified range and in densely packed device areas, a significant yield loss may occur which may frequently be caused by leakage current paths or even short circuits 104, which may connect the contact elements 106A, 106B across the isolation structure 102. Consequently, densely packed device regions may be extremely failure prone, thereby contributing to a significantly reduced production yield for sophisticated semiconductor devices. For this reason, significant efforts are made in order to avoid deposition-related irregularities during the formation of stress-inducing materials in sophisticated semiconductor devices, thereby contributing to additional process complexity.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein addresses the problem of increased yield losses in extremely scaled semiconductor devices, which are caused by leakage current paths created during the formation of contact elements in the contact level of the semiconductor devices. Without intending to restrict the present disclosure to the following explanation, it is assumed that an increased probability of creating voids during the deposition of an interlayer dielectric material, such as a stress-inducing dielectric material, may be caused by the specific geometry of the spacer structure formed on sidewalls of the gate electrode structures of closely spaced transistor elements. It is believed that a multi-station deposition of the spacer material may result in a disadvantageous shape of the spacer elements after the anisotropic etch process, which may result in a more complex surface topography for the deposition of the stress-inducing dielectric material. It is assumed that the provision of a plurality of sub-layers, such as three sub-layers in a multi-station deposition process, may lead to a certain degree of "under-etching" or notch formation at a lower portion of the spacer elements, which may therefore increase the probability of generating overhangs during the subsequent deposition of the dielectric material, thereby creating voids which may laterally extend between contact elements of closely spaced active areas, thereby contributing to increased leakage currents. For this reason, the present disclosure provides manufacturing techniques and semiconductor devices in which a multi-station deposition may be used to provide a high degree of compatibility with conventional process strategies, wherein, however, process parameter values of at least one process parameter may be selected differently for two subsequent deposition steps so as to create a spacer layer stack of varying "characteristics," such as layer thickness, thereby also achieving "non-regular" etch behavior during the subsequent anisotropic etch process. Based on this intentionally introduced "irregularity" in the stack of sub-layers of the spacer material, any etch-related effects may be "averaged" more efficiently compared to the regular arrangement of the sub-layers in the conventional techniques, which may thus result in a significantly less pronounced degree of under-etching or notch formation at the lower portion of the spacer elements. Consequently, during the deposition of the stress-inducing material in a later manufacturing stage, superior process conditions may be present, thereby reducing the probability of creating voids in the stress-inducing dielectric material. Moreover, the superior shape of the spacer elements may also provide enhanced uniformity during the implantation processes and silicidation processes to be performed on the basis of the spacer elements.

One illustrative method disclosed herein comprises performing at least two separate deposition processes on the basis of the same precursor materials by using two different values of at least one process parameter so as to form a spacer material above a plurality of gate electrode structures of a semiconductor device. The method further comprise removing material of the spacer material by performing an anisotropic etch process in order to form sidewall spacer elements from the spacer material. Additionally, the method comprises forming a stress-inducing dielectric layer above and between the plurality of gate electrode structures and forming contact elements in the dielectric stress-inducing layer, wherein the contact elements connect to the plurality of gate electrode structures.

A further illustrative method disclosed herein comprises performing a sequence of separate deposition processes so as to form a plurality of sub-layers of a spacer material above a plurality of gate electrode structures of a semiconductor device, wherein at least two of the plurality of sub-layers have a different thickness. Moreover, the method comprises forming a spacer element on sidewalls of each of the plurality of gate electrode structures from the plurality of sub-layers of the spacer material. Additionally, a first interlayer dielectric material is formed above and between the plurality of gate electrode structures and a second interlayer dielectric material is formed above the first interlayer dielectric material. Moreover, the method comprises forming contact elements in the first and second interlayer dielectric materials.

One illustrative semiconductor device disclosed herein comprises a plurality of gate electrode structures that are at least partially formed above a semiconductor region. The semiconductor device further comprises a spacer element formed on sidewalls of each of the plurality of gate electrode structures, wherein the spacer element comprises at least two sub-layers of substantially the same material composition and with different thicknesses. Additionally, an interlayer dielectric material is formed between and above the gate electrode structures and comprises a stress-inducing dielectric material. Additionally, the semiconductor device comprises a contact element embedded in the interlayer dielectric material and extending to the semiconductor region.

BRIEF DESCRIPTION OF THE DRAWINGS

The disclosure may be understood by reference to the following description taken in conjunction with the accompanying drawings, in which like reference numerals identify like elements, and in which.

Figure 1A:
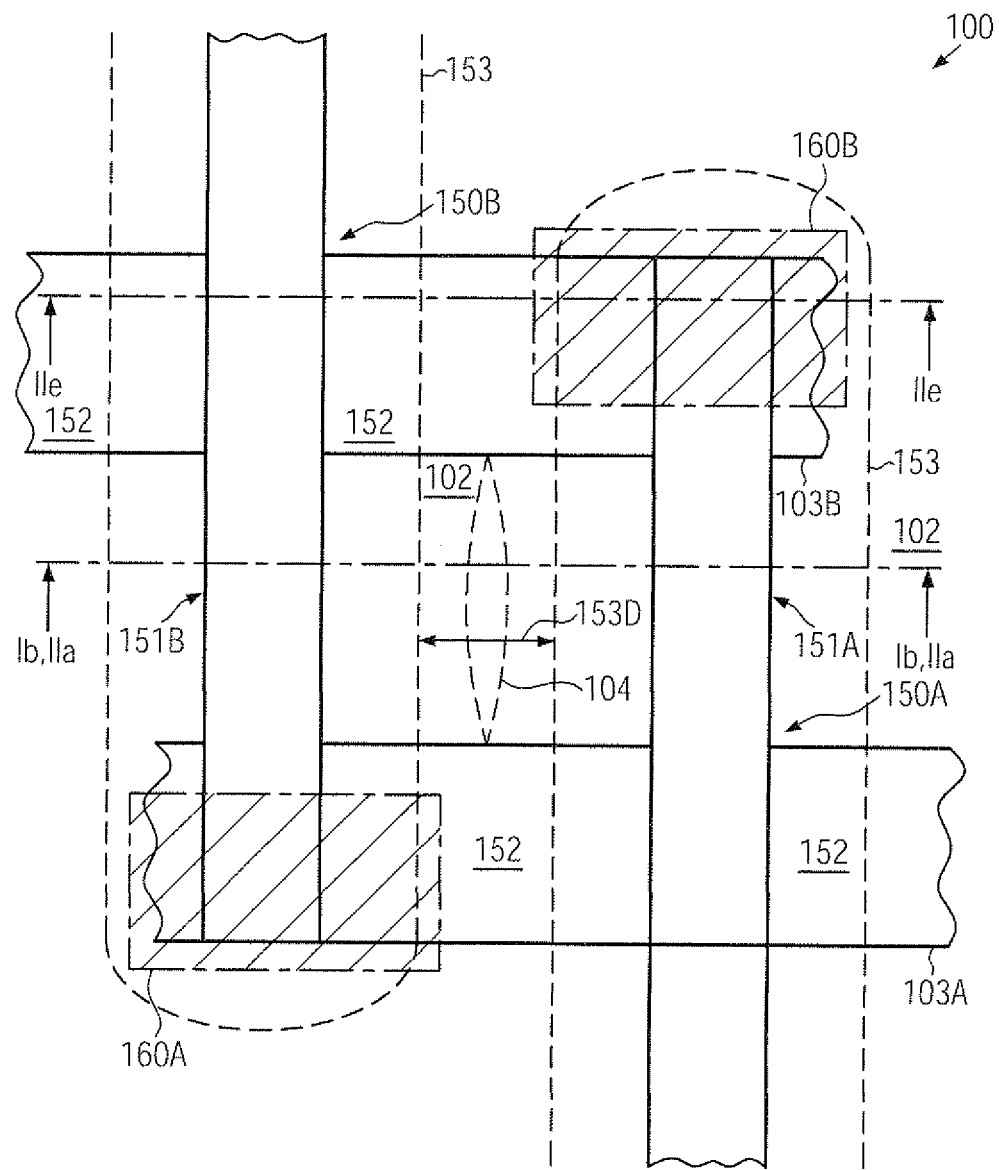
FIG. 1a schematically illustrates a top view of a semiconductor device including closely spaced transistor elements and a gate electrode structure formed on the basis of conventional process strategies, thereby causing a high probability of creating leakage current paths between contact elements of adjacent active regions.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides techniques and semiconductor devices in which enhanced process uniformity may be accomplished during the formation of contact elements in densely packed device regions on the basis of spacer elements formed in accordance with a multi-station deposition process. It should be appreciated that the present disclosure should not be considered as being restricted to the following explanation provided with reference to FIGS. 1b-1e and also with reference to FIG. 1a, wherein a mechanism is described and is believed to be a major cause of contact failures in sophisticated semiconductor devices. Consequently, according to the principles disclosed herein, a certain degree of "irregularity," for instance, in the form of a varying layer thickness, may be introduced into the multi-station deposition process sequence in order to provide a superior spacer shape after the anisotropic etch process.

With reference to FIGS. 1b-1e, the failure mechanism may be described, and with reference to FIGS. 2a-2e, further illustrative embodiments will now be described in more detail, wherein reference may also be made to FIG. 1a when appropriate.

Figure 1B:
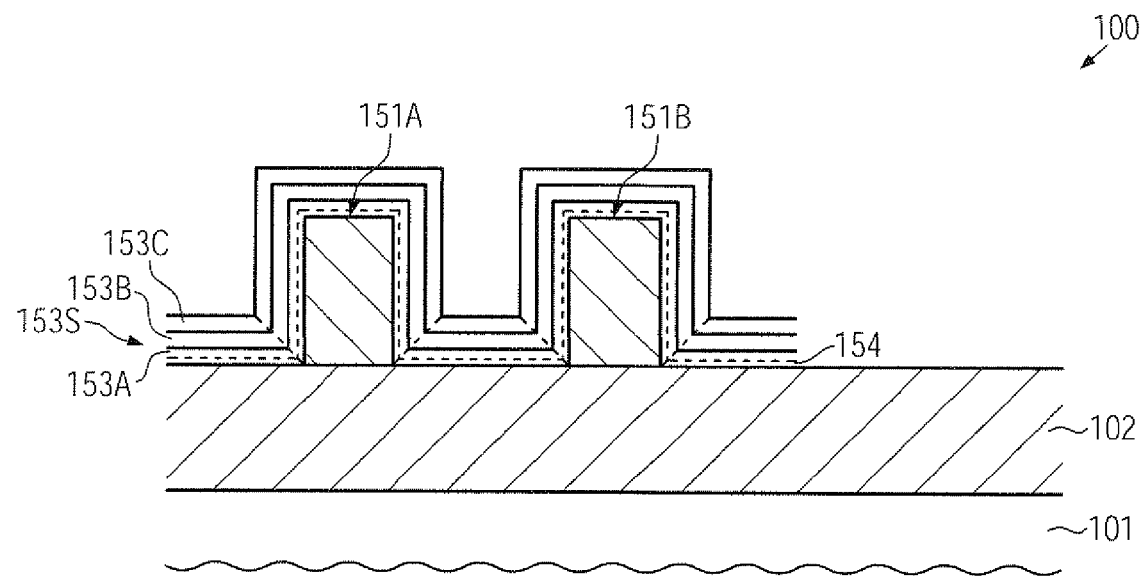
FIG. 1b schematically illustrates a cross-sectional view along a section as indicated in FIG. 1a, wherein a spacer material may be provided with three sub-layers of identical thickness according to conventional strategies, which is believed to represent a source of contact failures in a later manufacturing stage.

FIG. 1b schematically illustrates a cross-sectional view of the semiconductor device 100 taken along the line Ib of FIG. 1a. As illustrated, the device 100 comprises a substrate 101 above which is formed the isolation structure 102. Furthermore, the gate electrode structures 151A, 151B, which may be comprised of any appropriate materials as described above, are illustrated in combination with a spacer material 153S that is provided in the form of three substantially identical sub-layers 153A, 153B and 153C. That is, the sub-layers 153A, 153B, 153C are typically provided as silicon nitride material with a substantially identical layer thickness. Furthermore, frequently, an etch stop liner 154, such as a silicon dioxide layer, may be formed between the isolation structure 102 and the gate electrode structures 151A, 151B and the spacer material 153S.

Figure 1C:
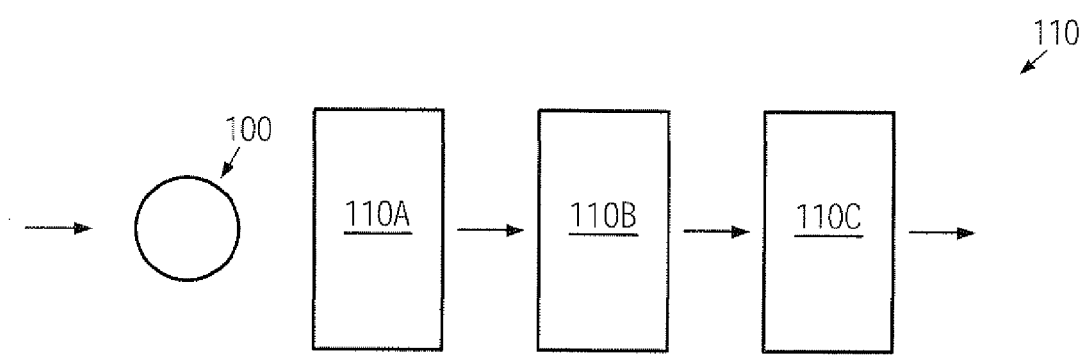
FIG. 1c schematically illustrates a multi-station deposition process for forming a spacer material.

FIG. 1c schematically illustrates a typical process flow 110 for forming the spacer material 153S (FIG. 1b). For example, three deposition stations, for instance in the form of any appropriate process chamber of a cluster tool and the like, may be provided, thereby establishing respective deposition ambients 110A, 110B and 110C, which the device 100 may sequentially pass. Thus, during the deposition process 110A, the sub-layer 153A (FIG. 1b) may be formed and thereafter the device 100 may be passed on to the process ambient 110B, while another substrate may be positioned in the ambient 110A, thereby providing a pipelined substrate processing flow for increasing overall throughput. In the ambient 110B, the layer 153B (FIG. 1b) may be deposited and similarly the layer 153C (FIG. 1b) may be generated in the ambient 110C, wherein identical process parameter values may be used in each of the deposition processes 110A, 110B, 110C.

Figure 1D:
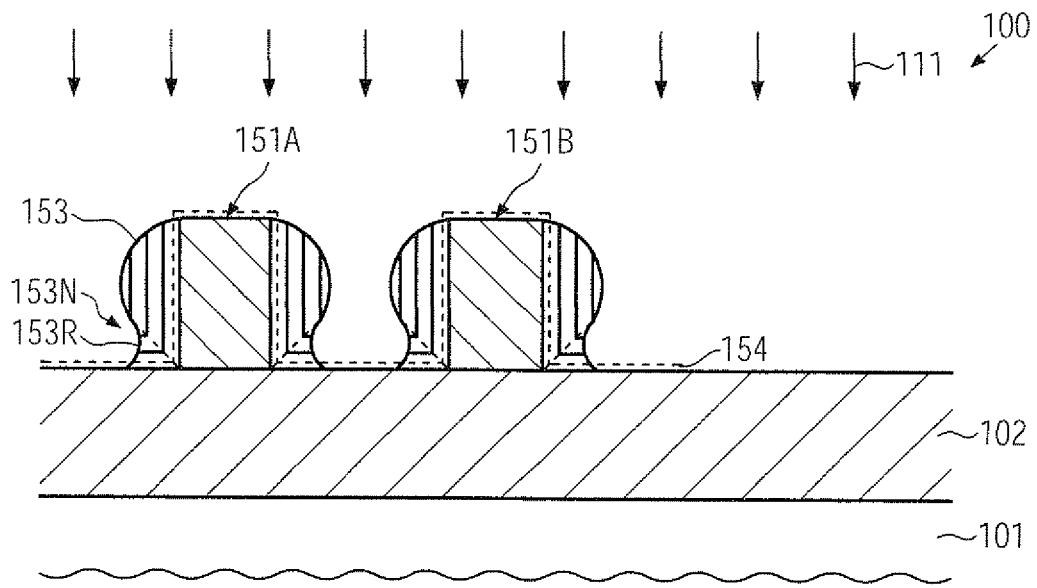
FIGS. 1d-1e schematically illustrate cross-sectional views of a conventional semiconductor device with under-etched spacer elements and with a corresponding stress-inducing dielectric material having formed therein a void which is believed to be caused by the spacer shape of FIG. 1d.

FIG. 1d schematically illustrates the semiconductor device 100 when exposed to an anisotropic etch ambient 111 in order to form the spacer elements 153. During the process 111, a certain notch or under-etched area 153N may be formed, which is believed to stem from a "regular" structure of "seams" 153R, which may result in a non-desired relatively high etch rate during the process 111.

Figure 1E:
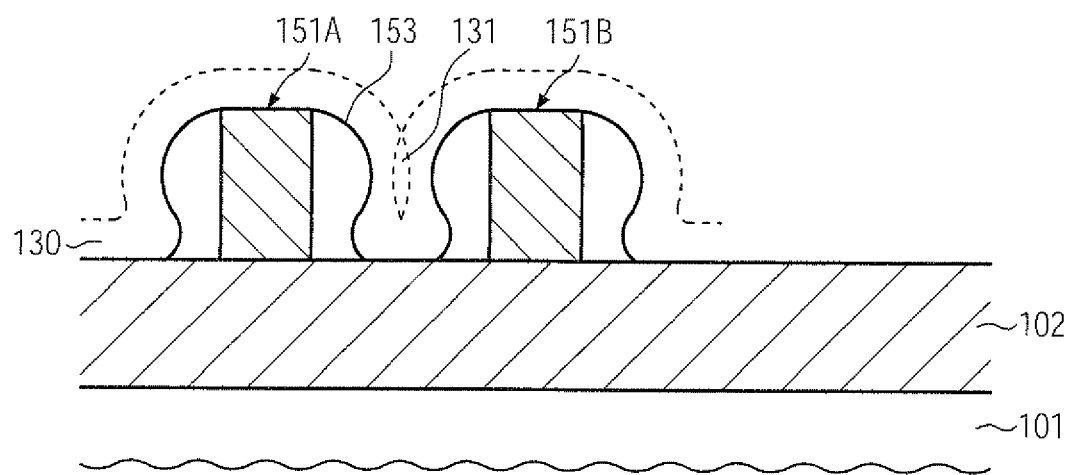

FIG. 1e schematically illustrates the semiconductor device 100 in a further advanced manufacturing stage, i.e., after forming drain and source regions and metal silicide areas (not shown) in the drain and source areas, possibly in combination with metal silicide regions (not shown) in the gate electrode structures 151A, 151B, wherein a stress-inducing dielectric material 130 may be deposited on the basis of well-established deposition recipes. Consequently, during deposition, a void 131 may be created due to the notched shape of the spacer elements 153. The void 131 may extend across the isolation structure 102, as shown in FIG. 1a, and may be filled, at least partially, during the formation of the contact elements 160A, 160B of FIG. 1a, thereby resulting in contact failure.

Consequently, according to the principles disclosed herein, a certain degree of irregularity or variability of the spacer material may be generated, however, without unduly affecting overall cycle time and uniformity of the spacer elements in order to reduce the probability of creating increased leakage current paths.

Figure 2A:
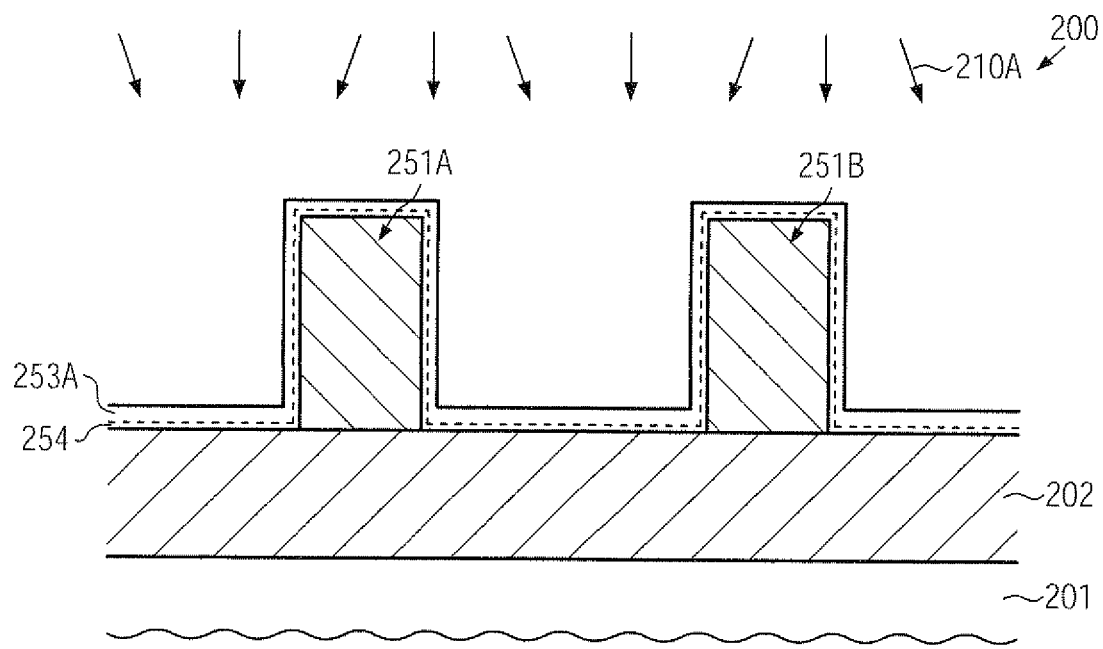
FIGS. 2a-2c schematically illustrate cross-sectional views of a semiconductor device according to a section as illustrated in FIG. 1a, wherein a spacer material may be formed in a multi-station deposition process with at least one varying process parameter, according to illustrative embodiments.

FIG. 2a schematically illustrates a semiconductor device 200 in a cross-sectional view which may basically correspond to a section as indicated in FIG. 1a as IIa. As illustrated, the semiconductor device 200 may comprise a substrate 201 above which may be formed an isolation structure 202, which may define corresponding active regions, as explained above with reference to FIG. 1a. Furthermore, gate electrode structures 251A, 251B may be formed on the isolation structure 202 and on corresponding active regions, as previously explained with reference to the semiconductor device 100. With respect to any characteristics of the gate electrode structures 251A, 251B, such as material composition, gate length and the like, the same criteria may apply as previously explained. Moreover, in the manufacturing stage shown, an etch stop liner 254, such as a silicon dioxide liner and the like, may be formed on the isolation structure 202 and the gate electrode structures 251A, 251B, if required, followed by a first sub-layer 253A of a spacer material. For example, the first sub-layer 253A may be comprised of silicon nitride, wherein, however, it should be appreciated that any other material composition may be applied if compatible with the overall process and device requirements.

With respect to manufacturing strategies for forming the gate electrode structures 251A, 251B, the same criteria may apply as previously explained with reference to the semiconductor device 100. After the patterning of the gate electrode structures 251A, 251B, followed by a formed portion of drain and source regions, the spacer layer 254 may be deposited on the basis of any appropriate deposition recipe. Thereafter, a deposition process 210A may be performed on the basis of appropriately selected process parameters in order to form the sub-layer 253A. It should be appreciated that the deposition ambient of the process 210A may be established in any appropriate process chamber, for instance in one of a plurality of process chambers of a cluster tool in order to establish a sequential deposition sequence of separate deposition steps to obtain a spacer material in accordance with a very efficient overall process flow. However, contrary to the conventional strategy described with reference to FIGS. 1b-1c, the sequence of separate deposition processes may be performed on the basis of at least a different process parameter value so as to introduce a certain degree of irregularity, for instance with respect to layer thickness and the like. For example, during the deposition process 210A, process temperature, pressure and the like may be appropriately adjusted in order to form a desired material composition by using a specified precursor system. For example, a moderately short deposition time may be realized, for instance, by discontinuing the supply of the precursor material, wherein the substrate 201 may remain within the corresponding deposition chamber since in one or more subsequent deposition chambers of the sequence of separate deposition processes a longer actual deposition time may be applied. If a moderately short deposition time may be selected for the process 210A, the thickness of the layer 253A may be reduced compared to conventional strategies wherein, depending on the selection of other process parameters, a certain difference in layer thickness between a layer portion formed on the isolation structure 202 and the gate electrode structures 251A, 251B may be accomplished. For example, a slight temperature gradient between the isolation structure 202 and the gate electrodes 251A, 251B may result in a slightly different deposition rate, at least at the beginning of the deposition process 210A.

Figure 2B:
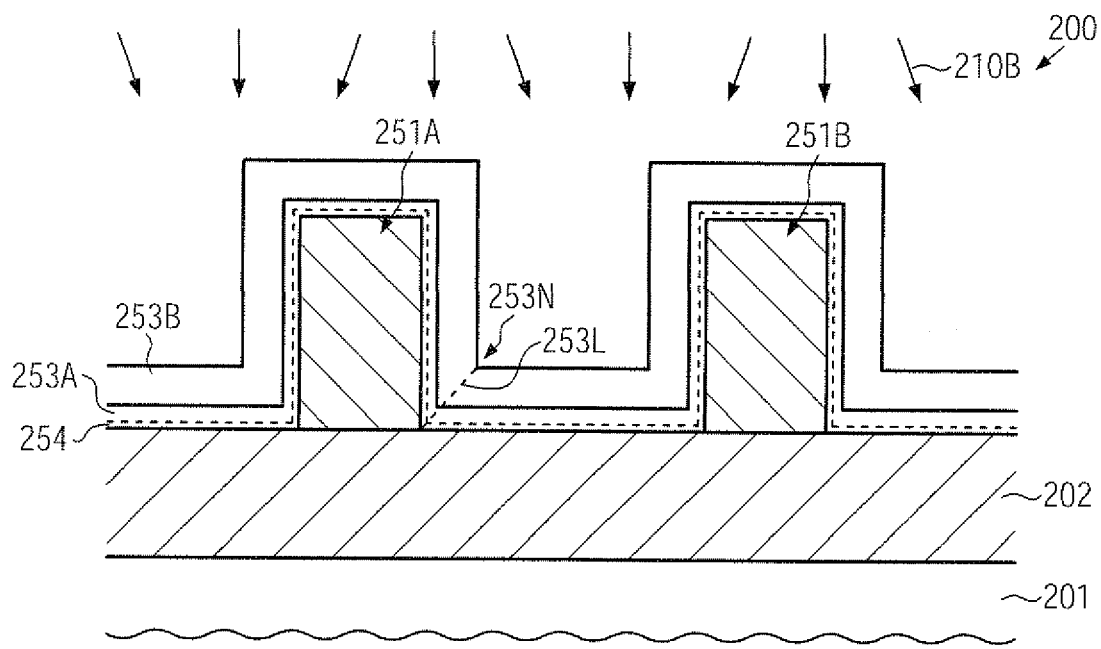

FIG. 2b schematically illustrates the semiconductor device 200 when exposed to a further deposition ambient 210B in order to form a further sub-layer 253B, which, in the embodiment shown, may differ from the sub-layer 253A in its thickness. For example, the layer 253B may be formed so as to exhibit a greater layer thickness compared to the layer 253A, for instance, by a factor of approximately 2 or less, so that, in total, a different degree of inhomogeneity may be provided in a seam region 253N. That is, a liner 253L defined by an interface area connecting substantially vertically grown material portions and horizontally grown material portions of the layers 253A, 253B may have a significantly different configuration compared to a corresponding regular configuration obtained in the conventional process strategy described with reference to FIGS. 1b and 1c. It should be appreciated that the further "modulation" of the interface area 253L may be accomplished by varying process parameters, such as deposition pressure, temperature and the like, so as to obtain a slight difference in the deposition behavior, as explained above. Hence, basically the same material composition for the layers 253A, 253B may be obtained, while nevertheless a certain degree of irregularity may be introduced in the region 253N. It should be appreciated that a difference in thickness as shown in FIG. 2b may be obtained in some illustrative embodiments by selecting different process times, i.e., actual deposition times, during which the precursor materials may be present in the deposition atmospheres 210A, 210B, while any other process parameter values may have substantially the same value for both deposition processes 210A, 210B. In this case, the total cycle time of the combined processes 210A, 210B may be increased for a given desired total thickness of a spacer material since, in a sequential deposition sequence, the longer deposition time in the step 210B may determine the overall cycle time. In other illustrative embodiments, additional process chambers may be assigned to the process step 210B so that the corresponding output of the deposition process 210B in a cluster tool may be comparable to the process output of the deposition step 210A producing the reduced layer thickness on the basis of a reduced deposition time. Consequently, a multi-station deposition sequence may be efficiently applied while nevertheless providing different characteristics of the layers 253A, 253B in view of inhomogeneities formed in the region 253N, for instance by providing different layer thicknesses.

Figure 2C:
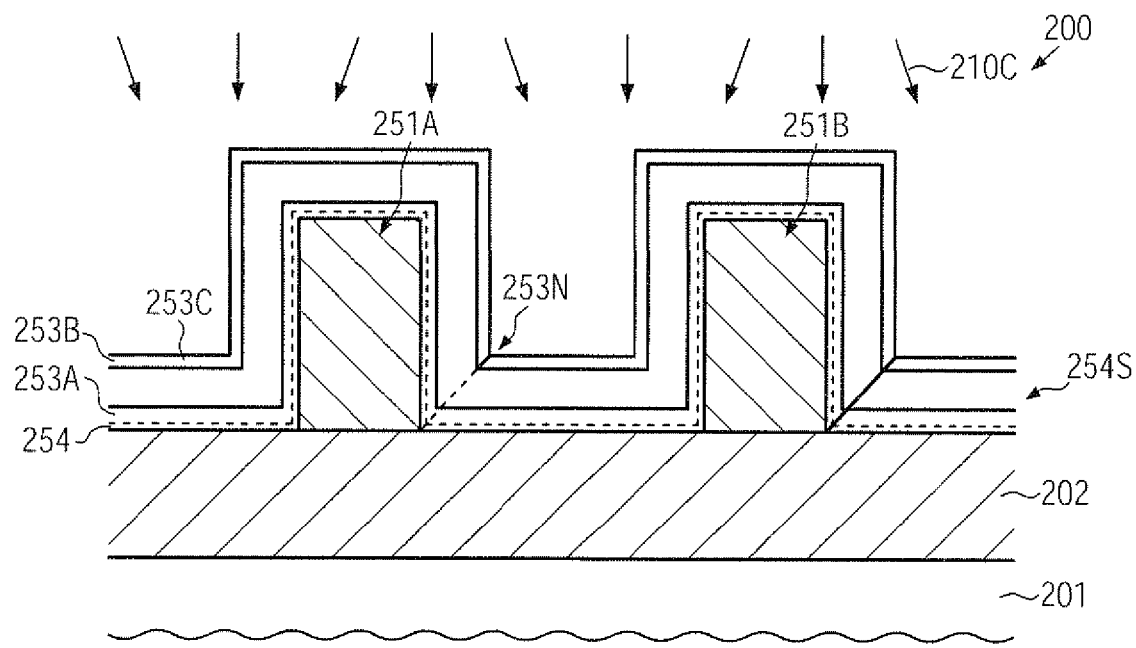

FIG. 2c schematically illustrates the semiconductor device 200 according to further illustrative embodiments in which the device 200 may be exposed to a further deposition process 210C that may be established on the basis of the same precursor materials as the processes 210A, 210B in order to form a further sub-layer 253C. For example, the layer 253C may be deposited on the basis of a parameter setting that provides an additional irregularity in the seam region 253N, for instance by selecting a layer thickness that differs from the layer thickness of the sub-layer 253B. In the illustrative embodiment shown, a significantly reduced thickness may be selected for the layer 253C compared to the layer 253B. With respect to a process parameter adjustment, such as actual deposition time, temperature, pressure and the like, the same criteria may apply as previously explained with reference to the deposition processes 210A, 210B. It should be appreciated, however, that the process parameter settings of these deposition processes may be selected such that, in total, a desired thickness of a spacer layer 254S may be obtained in accordance with device requirements. It should be appreciated that, if required, more than three sub-layers of the spacer material 254S may be deposited during a corresponding sequence of deposition processes. Consequently, the spacer material 254S may be provided with the desired overall material characteristics, for instance in the form of a silicon nitride material or any other appropriate spacer material, while at the same time the variation of at least one process parameter, such as deposition time, process temperature, process pressure and the like, may result in a certain degree of inhomogeneity in the region 253N for a given set of precursor materials, thereby reducing the probability of creating an undesired enhanced etch rate in the region 253N during the further processing of the semiconductor device 200.

Figure 2D:
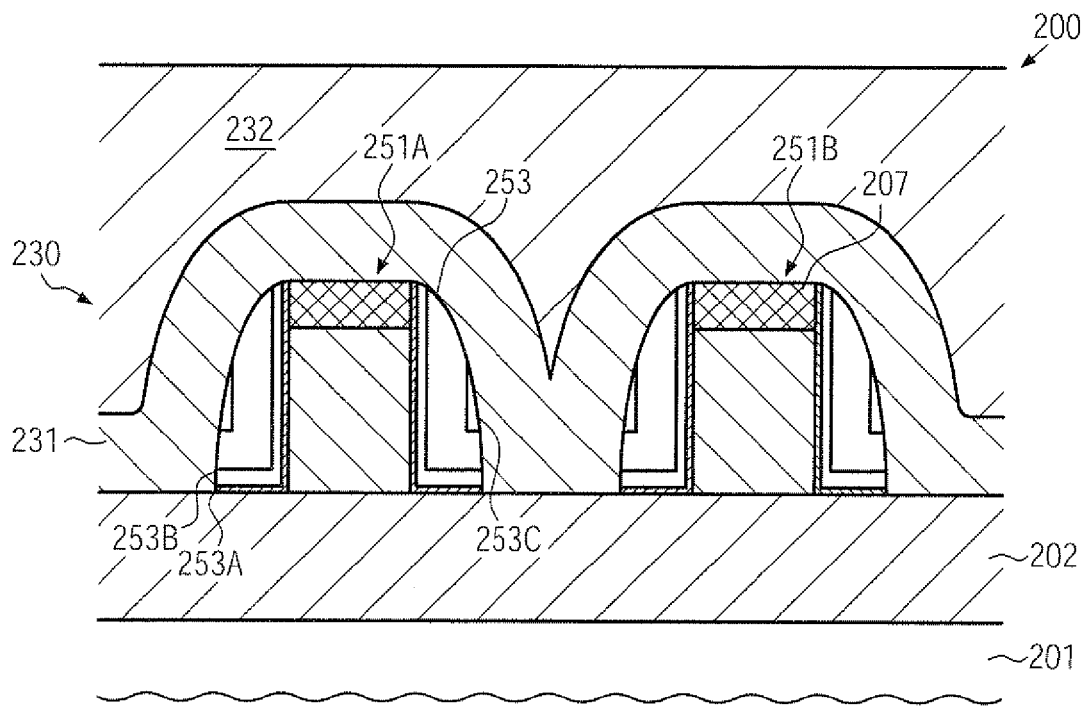
FIG. 2d schematically illustrates the semiconductor device in cross-sectional view in a further advanced manufacturing stage according to illustrative embodiments.

FIG. 2d schematically illustrates the semiconductor device 200 in a further advanced manufacturing stage. As illustrated, the semiconductor device 200 may comprise the gate electrode structures 251A, 251B, which may possibly include a metal silicide region 207, when a silicon material may be used at least as a portion of the gate electrode structures 251A, 251B. Furthermore, a spacer structure 253 may be formed on sidewalls of the gate electrode structures 251A, 251B and may be comprised of portions of the sub-layers 253A, 253B, 253C. As illustrated, the spacer elements 253 may have a significantly improved shape compared to the conventionally created spacers 153 as shown in FIG. 1d. Consequently, based on a significantly less pronounced degree of under-etching or by providing the spacers 253 substantially without any under-etched areas, a portion of an interlayer dielectric material 230, such as a stress-inducing material 231, may be formed on the basis of significantly enhanced deposition conditions, thereby avoiding or at least significantly reducing the creation of any deposition-related irregularities, such as voids, as is, for instance, the case for the semiconductor device 100 as illustrated in FIG. 1e. Moreover, the device 200 may comprise a further interlayer dielectric material 232, for instance in the form of silicon dioxide and the like.

The semiconductor device 200 may be formed on the basis of process techniques as previously described. That is, after forming the spacer layer 254S comprising at least two layers 253A, 253B, 253C with a different layer thickness, an anisotropic etch process may be performed, as previously explained with reference to FIG. 1d, wherein, for a given well-established etch recipe, a superior shape of the spacers 253 may be obtained due to the intentionally introduced "irregularity," as discussed above. Hence, further processing, i.e., the incorporation of a dopant species, may be based on enhanced process uniformity due to the enhanced shape of the spacers 253. Similarly, metal silicide regions in the drain and source areas may be formed with enhanced uniformity due to the superior shape of the spacers 253. Thereafter, dielectric material 231 may be deposited with a significantly reduced probability of creating overhangs, since the spacer elements 253 may be of increased width and may thus have maximum width at the bottom of the spacers 253. Consequently, the material 231 may be deposited in a highly conformal manner substantially without creating any voids between the gate electrode structures 251A, 251B. Thereafter, the interlayer dielectric material 232 may be deposited on the basis of deposition techniques having a superior gap filling capability, such as sub-atmospheric CVD and the like. If required, a planarization of the material 232 may be performed, for instance by chemical mechanical polishing (CMP) and the like. Thereafter, the interlayer dielectric material 230 may be patterned so as to receive openings which may subsequently be filled with an appropriate conductive material.

Figure 2E:
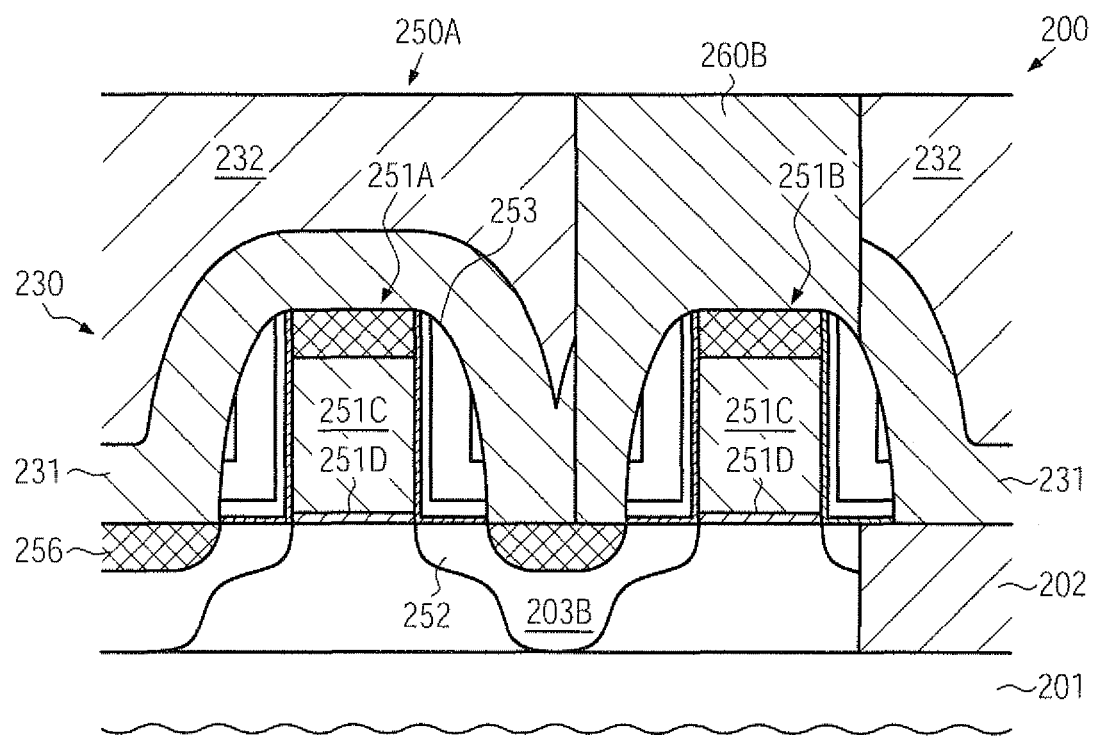
FIG. 2e schematically illustrates a cross-sectional view of the semiconductor device along a section as indicated in FIG. 1a, wherein a contact element may be formed with a significantly reduced probability of creating a leakage current path, according to illustrative embodiments.

FIG. 2e schematically illustrates the semiconductor device 200 in cross-sectional view along a section as indicated in FIG. 1a and denoted therein as section 11e. Thus, the semiconductor device 200 may comprise a first transistor 250A formed in and above an active region 203B, above which a gate electrode structure 251B may also be formed, as is for instance illustrated in FIG. 1a for the device 100. Furthermore, as shown in FIG. 1a, the gate electrode structure 251B may represent the gate electrode of a transistor that may be formed in a further active region (not shown in FIG. 2e). The gate electrode structures 251A, 251B may comprise an electrode material 251C, such as polysilicon, a metal and the like, depending on the complexity of the device 200, as is also previously explained. Furthermore, a gate dielectric material 251D may separate the electrode material 251C from the active region 203B. Furthermore, drain and source regions 252 may be formed in the active region 203B and may comprise metal silicide regions 256 wherein, as previously explained, the drain and source regions 252 and the metal silicide regions 256 may be formed on the basis of the spacers 253 with superior uniformity, as discussed above. Moreover, a contact element 260B may be formed so as to connect to the gate electrode structure 251B and also connect to the active region 203B, i.e., to the metal silicide region 256 formed therein. Due to the superior shape of the spacers 253 and the resulting improved fill capabilities during the deposition of the material 231, the patterning of the dielectric material 231 for forming a contact opening of the element 260B and the subsequent filling with a metal-containing material may thus be accomplished with enhanced reliability. That is, since the probability of creating a void in the material 231 may be significantly reduced, a corresponding opening of the void and the filling of the same with the conductive material during the formation of the contact element 260B may also be significantly reduced, thereby avoiding or at least reducing the formation of a corresponding leakage path as indicated in FIG. 1a by 104.

As a result, the present disclosure provides semiconductor devices and manufacturing techniques in which a superior shape of spacer elements may be obtained on the basis of a multi-station deposition technique, wherein a variability of the sub-layers may be introduced in order to enhance the etch behavior of the spacer material. For this reason, an enhanced device topography may be provided prior to the deposition of the stress-inducing dielectric material, which may thus be provided with a significant reduced probability of creating a void. Consequently, contact elements may be formed in densely packed device areas, such as RAM areas of sophisticated semiconductor devices, with increased production yield, while nevertheless an efficient multi-step deposition technique for forming spacer elements may be applied.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a gate electrode structure above a semiconductor substrate;
   forming an etch stop liner above said gate electrode structure, said etch stop liner having portions with a generally L-shaped configuration where said etch stop liner contacts said gate electrode structure and said substrate;
   performing at least two separate deposition processes on the basis of the same precursor materials by using two different values of at least one process parameter so as to form a spacer material above said etch stop layer, wherein the spacer material comprises a first sub-layer having a first thickness and a second sub-layer having a second thickness larger than the first thickness, and wherein the first sub-layer is formed on said portions of said etch stop layer having said L-shaped configuration and the second sub-layer is formed on said first sub-layer; and
   performing a common anisotropic etch process on said first and second sub-layers so as to form sidewall spacer elements from said first and second sub-layers, wherein a portion of each of said sidewall spacers elements contacts one of said portions of said etch stop layer having said L-shaped configuration.

2. The method of claim 1, further comprising:
   forming a stress-inducing dielectric layer above said gate electrode structure; and
   forming a contact element in said stress-inducing dielectric layer, said contact element connecting to said gate electrode structure.

3. The method of claim 1, wherein said two different values comprise two different processing times that are selected so as to form the first sub-layer having the first thickness and a the second sub-layer having the second thickness larger than the first thickness.

4. The method of claim 1, wherein the second sub-layer is approximately twice as thick or less than said first sub-layer.

5. The method of claim 1, wherein a gate length of said gate electrode is approximately 50 nm or less.

6. The method of claim 1, wherein said first and second sub-layers are comprised of a silicon nitride material.

7. The method of claim 6, wherein said etch stop layer is comprised of silicon dioxide.

8. A method, comprising:
   depositing a first layer of a spacer material above a gate electrode structure of a semiconductor device;
   depositing a second layer of the spacer material above the first layer, wherein the second layer is thicker than the first layer;
   depositing a third layer of the spacer material above the second layer, wherein the third layer is thinner than the second layer, said first, second and third layers being deposited on the basis of the same precursor materials by using different values of at least one process parameter; and
   performing a common anisotropic etching process on said first, second and third layers to form spacers adjacent the gate electrode structure.

9. The method of claim 8, wherein the second layer is approximately twice as thick or less than the first layer.

10. The method of claim 8, further comprising:
    forming a stress-inducing dielectric layer above said gate electrode structure; and
    forming a contact element in said stress-inducing dielectric layer, said contact element connecting to said gate electrode structure.

11. The method of claim 8, wherein the first, second, and third layers are comprised of a silicon nitride material.

12. The method of claim 11, wherein prior to depositing said first layer, the method comprises forming an etch stop liner above said gate electrode structure.

13. The method of claim 12, wherein said etch stop liner is comprised of silicon dioxide.

14. A method, comprising:
    forming a gate electrode structure above a semiconductor substrate;
    forming an etch stop liner above said gate electrode structure;
    depositing a first layer of a spacer material on said etch stop liner;

depositing a second layer of the spacer material on the first layer, wherein the second layer is thicker than the first layer;

depositing a third layer of the spacer material on the second layer, wherein the third layer is thinner than the second layer, said first, second and third layers being deposited on the basis of the same precursor materials by using different values of at least one process parameter; and performing a common anisotropic etching process on said first, second and third layers to form spacers adjacent the etch stop liner.

15. The method of claim 14, wherein said different values of said at least one process parameter are different deposition times.

16. The method of claim 14, wherein the second layer is approximately twice as thick or less than the first layer.

17. The method of claim 14, wherein the first, second, and third layers are comprised of a silicon nitride material.

18. The method of claim 17, wherein said etch stop liner is comprised of silicon dioxide.

19. A method, comprising:

depositing a first layer of a spacer material above a gate electrode structure of a semiconductor device;

depositing a second layer of said spacer material above said first layer, wherein said second layer is thicker than said first layer;

depositing a third layer of said spacer material above said second layer, wherein said third layer is thinner than said second layer, said first, second and third layers being deposited on the basis of the same precursor materials by using different deposition times to form said first, second and third layers having different thicknesses; and performing a common anisotropic etching process on said first, second and third layers to form spacers adjacent said gate electrode structure.

20. The method of claim 19, wherein said first, second and third layers are comprised of a silicon nitride material.

21. A method, comprising:

forming a gate electrode structure above a semiconductor substrate;

forming an etch stop liner above said gate electrode structure;

depositing a first layer of a spacer material on said etch stop liner;

depositing a second layer of said spacer material on said first layer, wherein said second layer is thicker than said first layer;

depositing a third layer of said spacer material on said second layer, wherein said third layer is thinner than said second layer, said first, second and third layers being comprised of a silicon nitride material; and performing a common anisotropic etching process on said first, second and third layers to form spacers adjacent said etch stop liner.

* * * * *